United States Patent
Chen et al.

(10) Patent No.: US 11,327,099 B2
(45) Date of Patent: May 10, 2022

(54) HIGH-PRECISION RESISTANCE MEASUREMENT SYSTEM AND METHOD COMBINING MICRO-DIFFERENTIAL METHOD AND RATIOMETRIC METHOD

(71) Applicant: CENTRAL SOUTH UNIVERSITY, Changsha (CN)

(72) Inventors: Zeyu Chen, Changsha (CN); Shaoqiang Liu, Changsha (CN); Dulin Li, Changsha (CN); Xiaoping Fan, Changsha (CN); Yiming Zhang, Changsha (CN)

(73) Assignee: CENTRAL SOUTH UNIVERSITY, Changsha (CN)

( * ) Notice: Subject to any disclaimer, the term of this patent is extended or adjusted under 35 U.S.C. 154(b) by 0 days.

(21) Appl. No.: 17/433,311

(22) PCT Filed: Jun. 5, 2020

(86) PCT No.: PCT/CN2020/094604
§ 371 (c)(1),
(2) Date: Aug. 24, 2021

(87) PCT Pub. No.: WO2020/253552
PCT Pub. Date: Dec. 24, 2020

(65) Prior Publication Data
US 2022/0091169 A1    Mar. 24, 2022

(30) Foreign Application Priority Data

Jun. 19, 2019  (CN) .......................... 201910529492.6

(51) Int. Cl.
*G01R 27/02* (2006.01)
*G01R 27/08* (2006.01)
(Continued)

(52) U.S. Cl.
CPC ............. *G01R 27/02* (2013.01); *G01R 27/08* (2013.01); *G01R 27/14* (2013.01); *G01R 19/0084* (2013.01); *G01R 19/0092* (2013.01)

(58) Field of Classification Search
CPC ...... G01R 27/00; G01R 27/02; G01R 27/025; G01R 27/08; G01R 27/14; G01R 27/16;
(Continued)

(56) References Cited

U.S. PATENT DOCUMENTS 4,160,949 A * 7/1979 McFayden ............. G01R 17/00
324/607
5,469,071 A * 11/1995 Obata .................... G01K 7/206
324/713
(Continued)

FOREIGN PATENT DOCUMENTS

CN          2702317 Y    5/2005
CN        102317798 A    1/2012
(Continued)

*Primary Examiner* — Hoai-An D. Nguyen
(74) *Attorney, Agent, or Firm* — Bayramoglu Law Offices LLC (57) ABSTRACT

Disclosed are a high-precision resistance measurement system and method combining a micro-differential method and a ratiometric method. The system includes a constant-current source, a reference resistor, a first differential amplifier, a programmable gain amplifier (PGA), an ADC, a microprocessor, a DAC and a to-be-measured resistor interface. The reference resistor and a to-be-measured resistor are connected in series between the constant-current source and ground. The voltage across the reference resistor is inputted to the first differential amplifier, and the output of the first differential amplifier is used as the reference voltage for the ADC and the DAC. The single-ended voltage to ground of the to-be-measured resistor and the output voltage of the DAC are inputted to the PGA in differential manner, and the PGA outputs the amplified difference voltage to the ADC.

(Continued)

The output terminal of the ADC and the input terminal of the DAC are both connected to the microprocessor.

12 Claims, 4 Drawing Sheets

(51) Int. Cl.
    *G01R 27/14*          (2006.01)
    *G01R 19/00*          (2006.01)

(58) Field of Classification Search
    CPC . G01R 19/00; G01R 19/0084; G01R 19/0092
    USPC ........ 324/600, 649, 691, 713; 702/1, 47, 53, 702/57, 64
    See application file for complete search history.

(56) References Cited

U.S. PATENT DOCUMENTS

| | | | | |
|---|---|---|---|---|
| 2009/0312970 | A1* | 12/2009 | Kalenine | G01R 15/09 702/64 |
| 2017/0264295 | A1* | 9/2017 | Slattery | H03K 19/17764 |
| 2018/0032211 | A1* | 2/2018 | King | G06F 1/1694 |
| 2019/0377016 | A1* | 12/2019 | Nakamura | G01R 27/16 |
| 2020/0271745 | A1* | 8/2020 | Das | G01R 23/02 |

FOREIGN PATENT DOCUMENTS

| | | | | |
|---|---|---|---|---|
| CN | 106383272 | A | 2/2017 | |
| CN | 110161313 | A | 8/2019 | |
| GB | 2587902 | A * | 4/2021 | ............ H03M 1/183 |
| JP | H0989952 | A | 4/1997 | |

* cited by examiner

HIGH-PRECISION RESISTANCE MEASUREMENT SYSTEM AND METHOD COMBINING MICRO-DIFFERENTIAL METHOD AND RATIOMETRIC METHOD

CROSS REFERENCE TO THE RELATED APPLICATIONS

This application is the national phase entry of International Application No. PCT/CN2020/094604, filed on Jun. 5, 2020, which is based upon and claims priority to Chinese Patent Application No.201910529492.6, filed on Jun. 19, 2019, the entire contents of which are incorporated herein by reference.

TECHNICAL FIELD

The present disclosure relates to the field of sensors and detection technologies and instrumentation, and specifically to a low-cost and high-precision resistance measurement system and method combining a micro-differential method and a ratiometric method.

BACKGROUND

Accurate resistance measurement is the basis for high-precision measurement of resistance sensors. Resistance sensors are widely used in practice, and there are many occasions requiring high-precision resistance measurement.

In an automatic detection system, high-precision resistance measurement usually adopts a digital measurement mode, and a measurement apparatus generally includes a microprocessor (CPU), an analog-to-digital converter (ADC), and a signal input circuit. Precision of a digital measurement system mainly depends on the precision and the number of bits of the ADC. Generally, more bits means higher resolution and higher precision of the system, which also indicates higher price. Microcontrollers of the MSP430F series from Texas Instruments of United States are exemplified. MSP430F5524 having a 12-bit ADC is much expensive than MSP430F5510 having a 10-bit ADC. Performance parameters of the two microcontrollers are substantially the same, but a price of the former is 3.05$ per thousand pieces, and a price of the latter is 1.70$ per thousand pieces (the two microcontrollers are merely different in non-volatile memory parameters, but it is easily learned through comparison of MSP430G2755 and MSP430G2855 that memories have little impact on the prices). A digital-to-analog converter (DAC) is usually required in the measurement system. The DAC is cheaper than the ADC. An 8-bit DAC such as DAC101S101 and a 10-bit DAC such as DAC081S101 are priced at about 0.5$ (all of the price data is from online quotation of device companies). The precision and the cost of the digital measurement system are largely affected by the ADC. As a result, the high-precision resistance measurement in practical applications is restricted by the high cost. Therefore, how to achieve high performance at a low cost is a key issue that needs to be addressed in research and development of a detection system based on sensitive resistance measurement.

An existing automatic detection system generally adopts a digital electrical measurement technology, which is mostly achieved by measuring a corresponding voltage change in response to a measured quantity change such as a resistance change. In sensors and measurement technologies, in order to reduce or eliminate measurement errors, the measurement methods to improve accuracy, such as a ratiometric method of measurement, a substitution method of measurement, and a micro-differential method of measurement are widely used. Although the methods have respective advantages, corresponding technical defects are still present.

The ratiometric method of measurement (referred to as a ratiometric method or ratiometric measurement for short) is to determine a measured quantity value by using a ratiometricity between a measured quantity and a quantity that is known. In application, a to-be-measured resistor is connected in series with a standard resistor or a precision reference resistor with high accuracy and low drift, and a resistance value of the to-be-measured resistor may be obtained merely by using the ratiometricity between terminal voltages of the two resistors and between resistance values of the two resistors. The implementation circuit using ratiometric measurement is simple and has a low cost. The ratiometric method just requires a short term stable current flowing through the series branch of the to-be-measured resistor and the reference resistor. A specific value of the current is not important in this method. In addition, conditions for achieving high-precision measurement by using the method actually still include high-precision voltage measurement.

The micro-differential method of measurement (referred to as a micro-differential method for short) is to determine a value of a measured quantity by comparing the measured quantity with a known quantity or a standard quantity of the same property and that is only slightly different from the measured quantity and measuring a micro difference between the two values. This method requires only the measurement of the difference between the two values. In addition, since an error of the standard quantity is very small, a high accuracy can still be obtained even if a measurement instrument with a relatively low precision is used. The capability of obtaining a high measurement precision by using a measurement instrument with a relatively low precision is a main advantage of the micro-differential method. However, the method is limited in practice. This is because it is difficult to obtain a standard quantity with the same property as the measured quantity but its value is slightly different from the measured quantity.

Therefore, it is difficult to achieve high-precision resistance measurement while reducing the cost of the measurement system by using the ratiometric method or the micro-differential method alone.

SUMMARY

In view of the above problems, the present disclosure provides a resistance measurement system and method combining a micro-differential method and ratiometric method, which can reduce the cost of the measurement system and achieving high-precision resistance measurement.

To achieve the foregoing technical objective, the present disclosure adopts the following technical solutions:

A high-precision resistance measurement system combining a micro-differential method and a ratiometric method includes a constant-current source, a reference resistor, a first differential amplifier, a programmable gain amplifier (PGA), an ADC, a microprocessor, a DAC, and a to-be-measured resistor interface. The to-be-measured resistor interface is configured to connect to a to-be-measured resistor.

The reference resistor and the to-be-measured resistor are connected in series to form a series branch, where one terminal of the series branch is connected to the constant-current source, and an other terminal of the series branch is grounded. Two input terminals of the first differential amplifier are respectively connected to two terminals of the reference resistor, and an output terminal of the first differential amplifier is connected to a voltage reference terminal of the ADC and the DAC. A first input terminal of the PGA is configured to connect to a single-ended voltage to ground of the to-be-measured resistor, a second input terminal of the PGA is operable to be selectively, connected to an output terminal of the DAC or ground, and an output terminal of the PGA is connected to an input terminal of the ADC. The single-ended voltage to ground of the to-be-measured resistor corresponds to a voltage drop across the to-be-measured resistor.

An output terminal of the ADC and an input terminal of the DAC are both connected to the microprocessor.

In the present disclosure, the to-be-measured resistor and the reference resistor are connected in series to construct a series branch, which is powered by a constant current source. The first differential amplifier, the PGA, the ADC, and the DAC are skillfully, configured to implement the measurement of the to-be-measured resistor in a mode combining a ratiometric method and a micro-differential method. The input of the first differential amplifier is the terminal voltage drop across the reference resistor, and the input of the PGA is the terminal voltage drop of the resistor to be measured (Corresponding to the first measurement of the micro-differential method. When performing the second measurement of the micro-differential method, the input of the PGA is the difference between the voltage drop across the resistor to be measured and the output voltage from the DAC). Therefore, the ratiometricity between the resistance values of the to-be-measured resistor and reference resistor and their terminal voltage drops, that is the ratio of the resistances equaling to the ratio of the terminal voltage drops of the resistors, can be transformed into the ratio of resistances is proportional to the ratio of the output of PGA and the output of first differential amplifier. Similarly, since the output of the first differential amplifier is used as the reference voltage of the ADC and the output of the PGA is the input of the ADC, the above-mentioned ratiometricity can be transformed into the ratio of resistances is proportional to the ratio of the analog-to-digital (A/D) conversion output of the ADC to its maximum conversion output. According to this ratiometricity, the function relationship between the measured resistance value and the reference resistance value, the amplification factor of the first differential amplifier and the PGA, the parameters of the ADC and the DAC, and the output value can be established. Since the output voltage of the DAC used to generate the difference in the second measurement is a quantity proportional to the first differential amplifier output voltage (that is the reference voltage of the ADC), and the value of the quantity is close to the terminal voltage value of the measured resistance, so the excitation current through the resistors can be completely eliminated and the power supply parameters are not included in the function. Therefore, the present disclosure can effectively overcome the influence of current changes and power supply fluctuations on measurement accuracy in resistance measurement, so as to improve the accuracy of the resistance measurement on the basis of reducing the system's accuracy requirements for the ADC.

Because the present disclosure has low requirements on a precision and stability of the constant-current source and on a resolution of the ADC, the present disclosure can further effectively reduce a construction cost of the measurement system.

Further, the constant-current source, the reference resistor, the to-be-measured resistor, and ground are connected in sequence to form the series branch, and the first input terminal of the PGA is connected to an ungrounded terminal of the to-be-measured resistor; or the system further includes a second differential amplifier, where the constant-current source, the to-be-measured resistor, the reference resistor, and ground are connected in sequence to form the series branch, two input terminals of the second differential amplifier are respectively connected to two terminals of the to-be-measured resistor, an output terminal of the second differential amplifier is connected to the first input terminal of the PGA, and the second differential amplifier has a gain factor of 2.

Further, a voltage reference terminal of the DAC is connected to the output terminal of the first differential amplifier.

Reference voltages for the ADC and the DAC are set to the same source (an output voltage $U_{REF}$ of the first differential amplifier) to eliminate resistor measurement errors caused by a change or an inaccurate value of a working current of the to-be-measured resistor as well as the reference voltages for the ADC and the DAC and changes thereof, that is, the influence of the power supply fluctuations on the high-precision measurement of the to-be-measured resistor can be overcome.

Further, a control terminal of the PGA is connected to the microprocessor, and an amplification factor of the PGA is set by the microprocessor.

Further, an amplification factor of the PGA satisfies the following condition: a voltage value outputted by the PG-A is less than a maximum conversion value of the ADC.

Further, the system includes: a first switch element, where a control terminal of the first switch element is connected to the microprocessor and is used by the microprocessor to control the second input terminal of the PGA to be connected to the output terminal of the DAC or ground; and/or a second switch element, where a control terminal of the second switch element is connected to the microprocessor and is used by the microprocessor to control the output terminal of the first differential amplifier to be connected to or disconnected from the voltage reference terminal of the ADC; and/or a third switch element, where a control terminal of the third switch element is connected to the microprocessor and is used by the microprocessor to control the output terminal of the first differential amplifier to be connected to or disconnected from the voltage reference terminal of the DAC.

A high-precision resistance measurement method combining a micro-differential method and a ratiometric method includes the following steps:

step 1: connecting a to-be-measured resistor to the to-be-measured resistor interface of any of the above systems, where the second input terminal of the PGA is connected to ground;

step 2: acquiring, by the microprocessor, an analog-to-digital conversion result corresponding to the to-be-measured resistor:

step 2.1: amplifying, by the PGA, a single-ended voltage to ground $U_S$ of the to-be-measured resistor by a factor of A1 to obtain a first voltage $U_S*A1$, performing, by the ADC, analog-to-digital conversion on the obtained first voltage $U_S*A1$ to obtain a first voltage digital quantity D1, and reading, by the microprocessor, the first voltage digital quantity D1 from the ADC;

step 2.2: calculating and outputting, by the microprocessor, a given voltage digital quantity D1' according to a number of bits or resolution of the DAC and transmitting the given voltage digital quantity to the DAC, performing, by the DAC, digital-to-analog conversion on the given voltage digital quantity D1' to obtain a given voltage U1, where $$D1' = \left\lfloor (D1-n) * \frac{p1}{A1} * \frac{1}{p2} \right\rfloor = \left\lfloor \frac{D1-n}{A1} * \frac{p1}{p2} \right\rfloor,$$

where $\lfloor \; \rfloor$ represents rounding down operation, p1 is the resolution of the ADC, p2 is the resolution of the DAC, n is a positive integer, and n/D1≤σ, where σ=1/10 or σ=1/8;

step 2.3: switching the second input terminal of the PGA from being connected to ground to being connected to the output terminal of the DAC, and step 2.4: differentially amplifying, by the PGA, the single-ended voltage to ground $U_S$ and the given voltage U1 of the to-be-measured resistor by a factor of A2 to obtain a second voltage $(U_S-U1)*A2$ performing, by the ADC, analog-to-digital conversion on the obtained second voltage $(U_S-U1)*A2$ to obtain a second voltage digital quantity D2, and reading, by the microprocessor, the second voltage digital quantity D2 from the ADC; and step 3: calculating, by the microprocessor, a resistance value $R_S$ of the to-be-measured resistor according to the following equation:

$$R_S = R_N * A_{REF} * \left( \frac{D1' * p2}{p1} + \frac{D2}{A2} \right) * \frac{1}{D_{FS}},$$

where
$R_N$ represents a resistance value of the reference resistor, $A_{REF}$ represents an amplification factor of the first differential amplifier, and $D_{FS}$ is the maximum conversion output numeric value of the ADC.

Further, the system further includes a first switch element, where a control terminal of the first switch element is connected to the microprocessor, where before step 2, the microprocessor controls the first switch element to connect the second input terminal of the PGA to ground; and during step 2.3, the microprocessor controls the first switch element to connect the second input terminal of the PGA to the output terminal of the DAC.

Further, the system further includes a second switch element and a third switch element, where control terminals of the second switch element and the third switch element are both connected to the microprocessor, where before step 2, the microprocessor controls the second switch element to be turned on to connect the output terminal of the first differential amplifier to the voltage reference terminal of the ADC; after step 3, the microprocessor controls the second switch element to be turned off to disconnect the output terminal of the first differential amplifier from the voltage reference terminal of the ADC;

before step 2, the microprocessor controls the third switch element to be turned on to connect the output terminal of the first differential amplifier to the voltage reference terminal of the DAC, and after step 3, the microprocessor controls the third switch element to be turned off to disconnect the output terminal of the first differential amplifier from the voltage reference terminal of the DAC.

Further, before step 2.1, the microprocessor sets the amplification factor of the PGA to A1, and after step 2.2 and before step 2.4, the microprocessor sets the amplification factor of the PGA to A2.

Beneficial Effects

In the present disclosure, the to-be-measured resistor and the reference resistor are connected in series to construct a series branch, which is powered by a constant current source. The first differential amplifier, the PGA, the ADC, and the DAC are skillfully configured to implement the measurement of the to-be-measured resistor in a mode combining a ratiometric method and a micro-differential method. The input of the first differential amplifier is the terminal voltage drop across the reference resistor, and the input of the PGA is the terminal voltage drop of the resistor to be measured (Corresponding to the first measurement of the micro-differential method. When performing the second measurement of the micro-differential method, the input of the PGA is the difference between the voltage drop across the resistor to be measured and the output voltage from the DAC). Therefore, the ratiometricity between the resistance values of the to-be-measured resistor and reference resistor and their terminal voltage drops, that is the ratio of the resistances equaling to the ratio of the terminal voltage drops of the resistors, can be transformed into the ratio of resistances is proportional to the ratio of the output of PGA and the output of first differential amplifier. Similarly, since the output of the first differential amplifier is used as the reference voltage of the ADC and the output of the PGA is the input of the ADC, the above-mentioned ratiometricity can be transformed into the ratio of resistances is proportional to the ratio of the A/D conversion output of the ADC to its maximum conversion output. According to this ratiometricity, the function relationship between the measured resistance value and the reference resistance value, the amplification factor of the first differential amplifier and the PGA, the parameters of the ADC and the DAC, and the output value can be established. Since the output voltage of the DAC used to generate the difference in the second measurement is a quantity proportional to the first differential amplifier output voltage (that is the reference voltage of the ADC), and the value of the quantity is close to the terminal voltage value of the measured resistance, so the excitation current through the resistors can be completely eliminated and the power supply parameters are not included in the function. Therefore, the present disclosure can effectively overcome the influence of current changes and power supply fluctuations on measurement accuracy in resistance measurement, so as to improve the accuracy of the resistance measurement on the basis of reducing the system's accuracy requirements for the ADC.

Because the present disclosure has low requirements on a precision and stability of the constant-current source and on a resolution of the ADC, the present disclosure can further effectively reduce a construction cost of the measurement system.

DETAILED DESCRIPTION OF THE EMBODIMENTS

Embodiments of the present disclosure are described in detail below. The embodiments are performed based on technical solutions of the present disclosure, and detailed implementations and specific operation processes are given to further explain the technical solutions of the present disclosure.

Embodiment I

Figure 1:
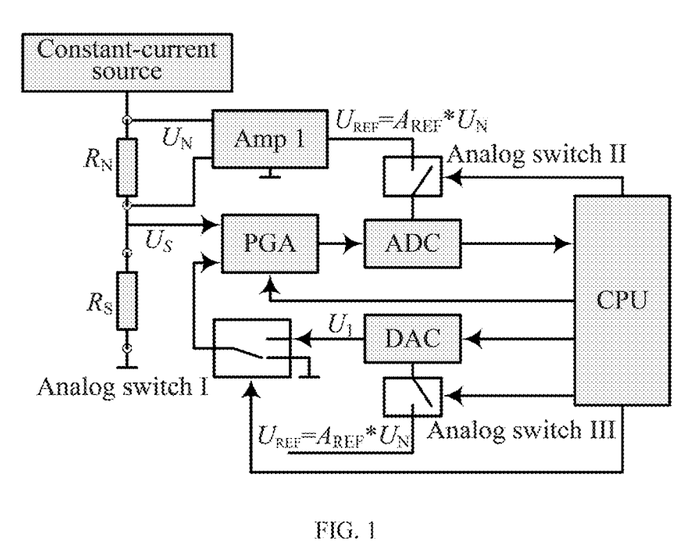
FIG. 1 is a functional block diagram of a measurement system according to Embodiment I of the present disclosure.
Figure 3:
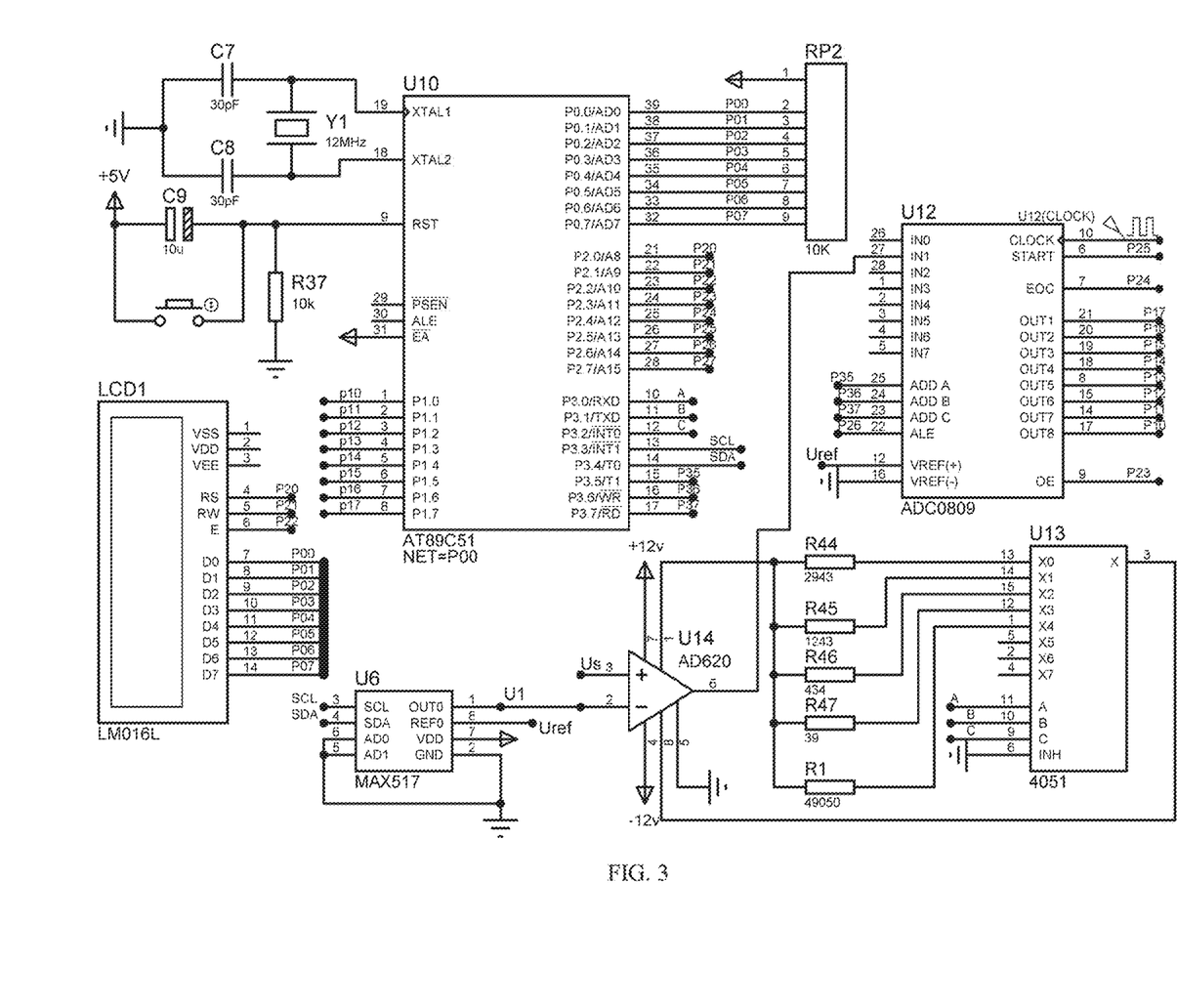
FIG. 3 is a design simulation circuit schematic of a measurement apparatus according to Embodiment I of the present disclosure.

This embodiment provides a high-precision resistance measurement system combining a micro-differential method and a ratiometric method. A principle block diagram of the system is shown in FIG. 1, and a detailed circuit diagram of the system is shown in FIG. 3. The system includes a to-be-measured resistor interface, a constant-current source, a reference resistor $R_N$, a first differential amplifier Amp1, a PGA, an ADC, a microprocessor (CPU), a DAC, a first analog switch I, a second analog switch II, and a third analog switch III.

A first terminal of the reference resistor is connected to a first terminal of the to-be-measured resistor interface, a second terminal of the reference resistor is connected to the constant-current source, and a second terminal of the to-be-measured resistor interface is grounded.

The two terminals of the reference resistor are respectively connected to two input terminals of the first differential amplifier Amp1. An output terminal of the first differential amplifier Amp1 is connected to a voltage reference terminal of the ADC through the second analog switch TI, and is connected to a voltage reference terminal of the DAC through the third analog switch HI. A control terminal of the second analog switch II and a control terminal of the third analog switch III are both connected to the microprocessor, and the second analog switch and the third analog switch are controlled by the microprocessor to be turned on and off. The voltage reference terminals described in this embodiment refer to a positive voltage reference terminal VREF(+) of the ADC or the DAC, and a negative voltage reference terminal VREF(−) is grounded.

A first input terminal of the PGA is connected to a second terminal of the to-be-measured resistor. A second input terminal of the PGA is connected to the first analog switch I. The control terminal of the first analog switch I is connected to the microprocessor, and the microprocessor controls the second input terminal of the PGA to be connected to an output terminal of the DAC or ground. An output terminal of the PGA is connected to an input terminal of the ADC. A control terminal of the PGA is connected to the microprocessor. An amplification factor of the PGA is controlled by the microprocessor, and the amplification factor satisfies the following condition: a voltage value outputted by the PGA is less than a maximum conversion value of the ADC. The maximum conversion value herein may be understood as a critical input value upon overflow after the ADC performs conversion.

An output terminal of the ADC and an input terminal of the DAC are both connected to the microprocessor.

In this embodiment, a model of the microprocessor (CPU) is AT89C51, a model of the ADC is 8-bit (binary) ADC0809, the DAC is MAX517 having the same resolution as the ADC, the PGA is composed of an instrumentation amplifier AD620, a multiplex switch CD4051, and a resistor element, a model of the first differential amplifier Amp1 is AD620, models of the second analog switch II and the third analog switch III are AD6821, a model of the first analog switch is ADG852, a voltage reference source is REF2933AIDBZT, and the reference resistor $R_N$ is a 100-ohm manganese copper resistor.

Figure 2:
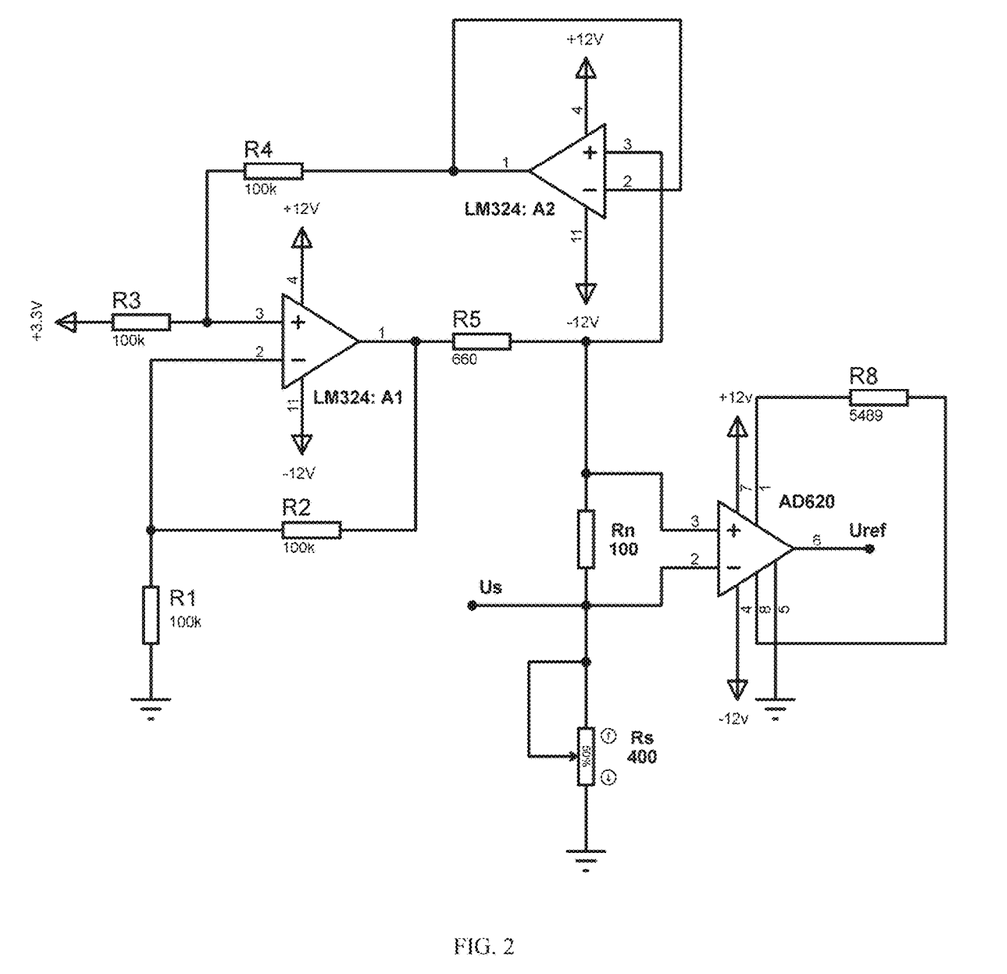
FIG. 2 is a design circuit schematic of a constant-current source and a reference voltage according to Embodiment I of the present disclosure.

A circuit of the constant-current, source used in this embodiment is a common solution for load-grounded constant current source circuits, and is mainly composed of a common voltage reference device and an operational amplifier, as shown in FIG. 2. In this embodiment, for a to-be-measured resistor below 400 ohms, an output of the constant-current source is adjusted so that a current of a series branch formed by the reference resistor and the to-be-measured resistor does not exceed 10 mA. For a to-be-measured resistor of 400~1000 ohms, the current should not exceed 5 mA (for a circuit having a working voltage of 5 V).

In addition, in this embodiment, the first differential amplifier Amp1 amplifies a terminal voltage $U_N$ of the reference resistor $R_N$ by a factor of $A_{REF}$, and transforms the voltage to a single-ended output voltage referenced to an analog ground potential (that is, a zero potential), which is provided as a common reference voltage $U_{REF}$ to the ADC and the DAC. In this way, measurement errors caused by a change or an inaccurate value of the working current of the to-be-measured resistor as well as the reference voltage $U_{REF}$ for the ADC and the DAC and changes thereof can be eliminated.

The amplification factor $A_{REF}$ of the first differential amplifier Amp1 is set according to an amplitude of the terminal voltage $U_N$ of the reference resistor $R_N$ and an allowable reference voltage value for the ADC and the DAC.

Corresponding to the above high-precision resistance measurement system, this embodiment further uses the system to further explain a method for measuring the to-be-measured resistor. The measurement method specifically includes the following steps:

Step 1: Connect the to-be-measured resistor to the to-be-measured resistor interface of the high-precision resistance measurement system combining a micro-differential method and a ratiometric method.

The system includes a constant-current source, a reference resistor, a first differential amplifier, a PGA, an ADC, a microprocessor, a DAC, and a to-be-measured resistor interface.

The to-be-measured resistor interface is configured to connect to a to-be-measured resistor.

The reference resistor and the to-be-measured resistor are connected in series to form a series branch, where one terminal of the series branch is connected to the constant-current source, and an other terminal of the series branch is grounded.

Two input terminals of the first differential amplifier are respectively connected to two terminals of the reference resistor, and an output terminal of the first differential amplifier is connected to a voltage reference terminal of the ADC and the DAC.

A first input terminal of the PGA is configured to connect to a single-ended voltage to ground of the to-be-measured resistor, a second input terminal of the PGA is operable to be selectively connected to an output terminal of the DAC or ground, and an output terminal of the PGA is connected to an input terminal of the ADC; the single-ended voltage to ground of the to-be-measured resistor corresponds to a voltage drop across the to-be-measured resistor.

An output terminal of the ADC and an input terminal of the DAC are both connected to the microprocessor.

Before step 2, it needs to be determined whether the second input terminal of the PGA is connected to ground, and if not, the control terminal of the first analog switch I needs to be controlled by the microprocessor to connect the second input terminal of the PGA to ground.

Before step 2, it needs to be further determined whether the output terminal of the first differential amplifier Amp1 is connected to the voltage reference terminal of the ADC and the voltage reference terminal of the DAC. If the voltage reference terminal of either the ADC or the DAC is not connected to the output terminal of the first differential amplifier Amp1, a control terminal of a corresponding analog switch needs to be controlled by the microprocessor to connect the voltage reference terminals of both the ADC and the DAC to the output terminal of the first differential amplifier Amp1 to receive the reference voltage $U_{REF}$ provided by the first differential amplifier Amp1.

Step 2: The microprocessor acquires calculated data of a resistance value.

Step 2.1: The PGA amplifies a single-ended voltage to ground $U_S$ of the to-be-measured resistor by a factor of A1 to obtain a first voltage $U_S*A1$, the ADC performs analog-to-digital conversion on the obtained first voltage $U_S*A1$ to obtain a first voltage digital quantity D1, and the microprocessor reads the first voltage digital quantity D1 from the ADC.

Before step 2.1, the method further includes setting the amplification factor of the PGA to A1 through the connection between the microprocessor and the control terminal of the PGA.

Step 2,2: The microprocessor calculates and outputs a given voltage digital quantity D1' according to a resolution of the DAC and the first voltage digital quantity D1 and transmits the digital quantity to the DAC which performs digital-to-analog conversion on the given voltage digital quantity D1 to obtain a given voltage U1.

$$D1' = \left\lfloor (D1-n) * \frac{p1}{A1} * \frac{1}{p2} \right\rfloor = \left\lfloor \frac{D1-n}{A1} * \frac{p1}{p2} \right\rfloor,$$

$\lfloor \ \rfloor$ where represents rounding down operation, p1 is the resolution of the ADC, p2 is the resolution of the DAC, n is a positive integer, and n/D1≤σ, where σ=1/10 or σ=1/2.

The microprocessor outputs the given voltage digital quantity D1' according to the above equation, so that an output voltage (that is, the given voltage U1) of the DAC is close to but slightly smaller than a to-be-measured voltage $U_S$ (that is, the single-ended voltage to ground $U_S$ of the to-be-measured resistor), thereby forming a slight difference to complete the high-precision resistance measurement.

Step 2.3: Switch the second input terminal of the PGA from being connected to ground to being connected to the output terminal of the DAC by controlling the control terminal of the first analog switch I through the microprocessor.

Step 2,4: The PGA differentially amplifies the single-ended voltage to ground $U_S$ and the given voltage U1 of the to-be-measured resistor by a factor of A2 to obtain a second voltage $(U_S-U1)*A2$ the ADC performs analog-to-digital conversion on the obtained second voltage $(U_S-U1)*A2$ to obtain a second voltage digital quantity D2, and the microprocessor reads the second voltage digital quantity D2 from the ADC.

After step 2.2 and before step 2.4, the method further includes: controlling, by the microprocessor, the amplification factor of the PGA to A2.

During setting of the amplification factor A1 of the PGA, the amplification factor is adjusted according to an advanced value of a gain level of the PGA, so that an analog-to-digital conversion result in step 2.1 that is, the first voltage digital quantity D1 does not overflow. In addition, in order to obtain more precise resistance measurement, the amplification factor A1 of the PGA is required to be as large as possible. Therefore, the amplification factor A1 further needs to satisfy: a most significant bit of the first voltage digital quantity D1 is 1 as far as possible (for a binary ADC). In other words, in this embodiment, the amplification factor A1 is adjusted according to an advanced value of a gain level of the PGA, and when the first voltage digital quantity D1 does not overflow, a larger amplification factor indicates a better effect, so that the conversion of the ADC has no overflow, the accuracy of the analog-to-digital conversion is ensured, and the precision of the resistance measurement is maximized.

In addition, during setting of the amplification factor A2 of the PGA, according to the improvement of the accuracy of the measurement system, it is required that an increase in a resolution of a corresponding ADC conversion digital result does not exceed a resolution of the ADC (that is, does not exceed a resolution capability of the ADC). The amplification factor of the PGA is adjusted according to an advanced number (binary or decimal) of a gain level, and it is ensured that an output of the PGA does not exceed an input upper limit or the resolution of the ADC.

Step 3: The microprocessor calculates a resistance value $R_S$ of the to-be-measured resistor according to the following equation:

$$R_S = R_N * A_{REF} * (D1'*p2/p1 + D2/A2)/D_{FS}, \text{ where}$$

where $R_N$ represents a resistance value of the reference resistor, $A_{REF}$ represents an amplification factor of the first differential amplifier, and $D_{FS}$ is the maximum conversion output numeric value of the ADC.

The resistance value of the to-be-measured resistor $R_S$ is calculated h combining the ratiometric method and the micro-differential method. A calculation process is:

$$R_S = R_N * \frac{U_S}{U_N}$$

$$= R_N * \frac{U_S}{U_{REF} * A_{REF}^{-1}}$$

$$= R_N * A_{REF} * \frac{U1 + (U_S - U1)}{U_{REF}}$$

$$= R_N * A_{REF} * \left( \frac{D1'}{D_{FS1}} + \frac{D2}{A2} * \frac{1}{D_{FS}} \right)$$

$$= R_N * A_{REF} * \left( \frac{D1'}{D_{FS1}} * D_{FS} + \frac{D2}{A2} \right) * \frac{1}{D_{FS}}$$

$$= R_N * A_{REF} * \left( \frac{D1' * p2}{p1} + \frac{D2}{A2} \right) * \frac{1}{D_{FS}}$$

where $$D1' = \left\lfloor (D1-n) * \frac{p1}{A1} * \frac{1}{p2} \right\rfloor = \left\lfloor \frac{D1-n}{A1} * \frac{p1}{p2} \right\rfloor,$$

$D_{FS}$ is the maximum output numeric value of the ADC, $D_{FS1}$ is the maximum input numeric value of the DAC, $D_{FS1}=1/p2$, and $D_{FS}=1/p1$.

Step 4: Control the control terminal of the first analog switch I through the microprocessor, so that the second input terminal of the PGA is connected to ground. The control terminal of the second analog switch II and the control terminal of the third analog switch III of the third analog switch are controlled through the microprocessor, so that the output terminal of the first differential amplifier Amp1 is disconnected from the voltage reference terminals of the ADC and the DAC.

Embodiment II

Figure 4:
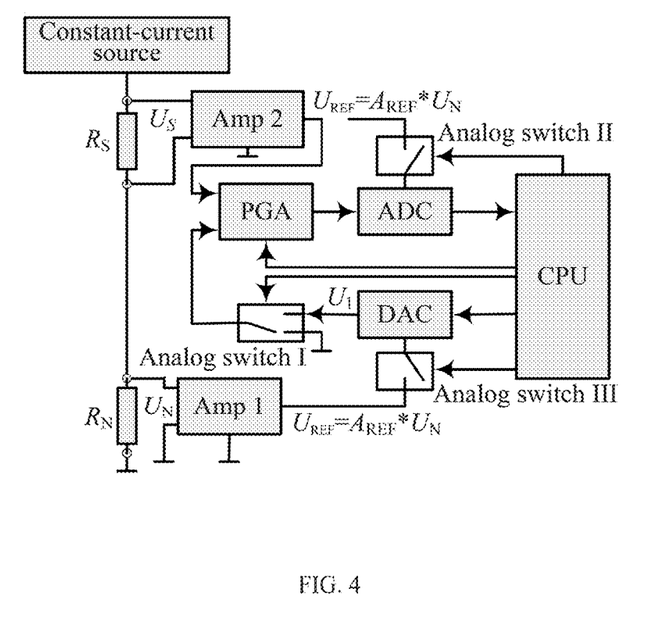
FIG. 4 is a functional block diagram of a measurement system according to Embodiment II of the present disclosure.

In Embodiment I, since one terminal of the to-be-measured resistor is grounded, a voltage of a common connection terminal for the to-be-measured resistor and the reference resistor is a single-ended voltage to ground corresponding to a voltage drop across the to-be-measured resistor, which may be directly inputted to the first input terminal of the PGA. Differences from Embodiment I lie in that, in Embodiment II, positions of the reference resistor and the to-be-measured resistor interface are transposed, and a second differential amplifier is disposed between the to-be-measured resistor and the PGA, as shown in FIG. 4. In Embodiment II, since both of the terminals of the to-be-measured resistor have non-zero potentials, a second differential amplifier Amp2 having a gain factor of 2 needs to be disposed between the to-be-measured resistor and the first input terminal of the PGA, to convert the voltage drop across the to-be-measured resistor to a single-ended voltage to ground and then input the single-ended voltage to ground to the PGA for amplification and calculation. The rest are the same as the solution of Embodiment I, and details are not described herein again.

sured resistance values, error correction amounts caused by conversion of the DAC, correction values of the measured resistances, absolute errors of the measured values, relative errors, values of corresponding amplification gains A2 and digital quantities D1', first voltage digital quantities D1, and second voltage digital quantities D2 are shown in Table 1 (in the table, n is sequentially taken as 3, 5, 6, 2, 9, 3, and 12).

TABLE 1

| No. | Actual resistance/Ω | Measured resistance/Ω | Correction amount/Ω | Correction value/Ω | Absolute error/Ω | Relative error/% | A2 | D1" | D1 | D2 |
|---|---|---|---|---|---|---|---|---|---|---|
| 1 | 100 | 100.3370 | 0.3676 | 99.969 | 0.031 | 0.031 | 128 | 18H | 33H | CBH |
| 2 | 150 | 150.5515 | 0.5515 | 150.000 | 0.000 | 0.000 | 64 | 24H | 4DH | 99H |
| 3 | 200 | 200.7966 | 0.7353 | 200.061 | 0.061 | 0.031 | 64 | 30H | 66H | CDH |
| 4 | 220 | 220.8333 | 0.8578 | 219.976 | 0.024 | 0.011 | 64 | 38H | 70H | 14H |
| 5 | 240 | 240.9314 | 0.9181 | 240.013 | 0.013 | 0.005 | 64 | 3CH | 7AH | 5CH |
| 6 | 300 | 301.1029 | 1 1029 | 300.000 | 0.000 | 0.000 | 32 | 48H | 99H | 99H |
| 7 | 350 | 351.3480 | 1.3480 | 350.000 | 0.000 | 0.000 | 32 | 58H | B3H | 33H |
| 8 | 400 | 401.4706 | 1.4706 | 400.000 | 0.000 | 0.000 | 32 | 60H | CCH | CCH |

In addition, a 10-bit DAC device TLC5615 is selected to replace the 8-bit DAC device MAX517 in Embodiment 1. Since the conversion voltage range of TLC5615 is 0~2 times the reference voltage, considering that it cannot exceed the power supply voltage, the reference voltage is caused to be $U_{REF}/2$ to perform the same test. Test results are shown in Table 2. It can be learned from Table 2 that a conversion result of the DAC does not need to be corrected. In order to distinguish between digital quantities corresponding to the 10-bit DAC and the 8-hit DAC herein, a digital quantity inputted by the CPU to the 10-bit DAC is denoted as D0, which is a digital quantity that is derived, in the same way as in the 8-bit DAC, by rounding a 10-bit result transformed from $D1'=(D1-n)/A1(D0=\lfloor D1''*p1/p2 \rfloor=\lfloor D1''*1024/255 \rfloor)$, and $R_S=R_N*A_{REF}*(D0*p2/p1+D2/A2)/D_{FS}$, where $p2/p1=255/1024\approx 1/4$.

It is learned from Table 1 and Table 2 that an average absolute error of the 8 test points is 0.016Ω, a maximum absolute error does not exceed 0.1Ω, an average relative error is 0.00975%, and a maximum relative error does not exceed 0.05%. It can be learned that the present disclosure can achieve high-precision resistance measurement and has a relatively excellent test effect.

TABLE 2

| No. | Actual resistance/Ω | Measured resistance/Ω | Absolute error/Ω | Relative effort/% | A2 | D1" | D0 | D1 | D2 |
|---|---|---|---|---|---|---|---|---|---|
| 1 | 100 | 99.969 | 0.031 | 0.031 | 128 | 18H | 60H | 33H | CBH |
| 2 | 150 | 150.000 | 0.000 | 0.000 | 64 | 24H | 90H | 4DH | 99H |
| 3 | 200 | 200.061 | 0.061 | 0.031 | 64 | 30H | C0H | 66H | CDH |
| 4 | 220 | 219.975 | 0.024 | 0.011 | 64 | 38H | E0H | 70H | 14H |
| 5 | 240 | 240.012 | 0.013 | 0.005 | 64 | 3CH | F0H | 7AH | 5CH |
| 6 | 300 | 300.000 | 0.000 | 0.000 | 32 | 48H | 121H | 99H | 99H |
| 7 | 350 | 350.000 | 0.000 | 0.000 | 32 | 58H | 161H | B3H | 33H |
| 8 | 400 | 400.000 | 0.000 | 0.000 | 32 | 60H | 181H | CCH | CCH |

In this embodiment, the measurement system of the present disclosure and the measurement method of the present disclosure adopt an ADC and a DAC both having 8 bits, that is, the two converters have the same resolution of 1/255. 8 groups of to-be-measured resistors having different resistance values are selected for measurement, and a simulation test is performed in a Proteus 7.8 software environment, where A1=2, $A_{REF}$=10, and $D_{FS}$=255 are set. Mea- The above embodiments are exemplary embodiments of this application, and those of ordinary skill in the art may further make various changes or improvements on this basis without departing from the general concept of this application. These changes or improvements shall fall within the scope of protection claimed by this application,

What is claimed is:

1. A high-precision resistance measurement system combining a micro-differential method and a ratiometric method, comprising: a constant-current source, a reference resistor, a first differential amplifier, a programmable gain amplifier (PGA), an analog-to-digital converter (ADC), a microprocessor, a digital-to-analog converter (DAC), and a to-be-measured resistor interface, wherein the to-be-measured resistor interface is configured to connect to a to-be-measured resistor;

the reference resistor and the to-be-measured resistor are connected in series to form a series branch, wherein one terminal of the series branch is connected to the constant-current source, and an other terminal of the series brand is grounded;

two input terminals of the first differential amplifier are respectively connected to two terminals of the reference resistor, and an output terminal of the first differential amplifier is connected to a voltage reference terminal of the ADC; a voltage reference terminal of the DAC is also connected to the output terminal of the first differential amplifier;

a first input terminal of the PGA is configured to connect to a single-ended voltage to ground of the to-be-measured resistor, a second input terminal of the PGA is operable to be selectively connected to an output terminal of the DAC or grounded, and an output terminal of the PGA is connected to an input terminal of the ADC, wherein the single-ended voltage to ground of the to-be-measured resistor corresponds to a voltage drop across the to-be-measured resistor; and an output terminal of the ADC and an input terminal of the DAC are both connected to the microprocessor.

2. The high-precision resistance measurement system according to claim 1, wherein the constant-current source, the reference resistor, the to-be-measured resistor, and ground are connected in sequence to form the series branch, and the first input terminal of the PGA is connected to an ungrounded terminal of the to-be-measured resistor; or the high-precision resistance measurement system further comprises a second differential amplifier, wherein the constant-current source, the to-be-measured resistor, the reference resistor, and ground are connected in sequence to form the series branch, two input terminals of the second differential amplifier are respectively connected to two terminals of the to-be-measured resistor, an output terminal of the second differential amplifier is connected to the first input terminal of the PGA, and the second differential amplifier has a gain factor of 2.

3. The high-precision resistance measurement system according to claim 1, wherein a control terminal of the PGA is connected to the microprocessor, and an amplification factor of the PGA is set by the microprocessor.

4. The high-precision resistance measurement system according to claim 1, wherein an amplification factor of the PGA satisfies the following condition: a voltage value outputted by the PGA is less than a maximum conversion value of the ADC.

5. The high-precision resistance measurement system according to claim 1, further comprising:

a first switch element, wherein a control terminal of the first switch element is connected to the microprocessor and is used by the microprocessor to control the second input terminal of the PGA to be connected to the output terminal of the DAC or ground; and/or a second switch element, wherein a control terminal of the second switch element is connected to the microprocessor and is used by the microprocessor to control the output terminal of the first differential amplifier to be connected to or disconnected from the voltage reference terminal of the ADC; and/or a third switch element, wherein a control terminal of the third switch element is connected to the microprocessor and is used by the microprocessor to control the output terminal of the first differential amplifier to be connected to or disconnected from the voltage reference terminal of the DAC.

6. A high-precision resistance measurement method combining a micro-differential method and a ratiometric method, comprising the following steps:

step 1: connecting a to-be-measured resistor to the to-be-measured resistor interface of the high-precision resistance measurement system according to claim 1, wherein the second input terminal of the PGA is grounded;

step 2: acquiring, by the microprocessor, an analog-to-digital conversion result corresponding to the to-be-measured resistor:

step 2.1: amplifying, by the PGA, a single-ended voltage to ground $U_S$ of the to-be-measured resistor by a factor of A1 to obtain a first voltage $U_S*A1$, performing, by the ADC, analog-to-digital conversion on the first voltage $U_S*A1$ to obtain a first voltage digital quantity D1, and reading, by the microprocessor, the first voltage digital quantity D1 from the ADC;

step 2.2: calculating and outputting, by the microprocessor, a given voltage digital quantity D1' according to a resolution of the DAC and transmitting the given voltage digital quantity to the DAC, performing, by the DAC, digital-to-analog conversion on the given voltage digital quantity D1' to obtain a given voltage U1, wherein $$D1' = \left\lfloor (D1-n) * \frac{p1}{A1} * \frac{1}{p2} \right\rfloor = \left\lfloor \frac{D1-n}{A1} * \frac{p1}{p2} \right\rfloor,$$

wherein $\lfloor \ \rfloor$ represents rounding down operation, p1 is a resolution of the ADC, p2 is the resolution of the DAC, n is a positive integer, and $n/D1 \leq \sigma$, wherein $\sigma = 1/10$ or $\sigma = 1/8$;

step 2.3: switching the second input terminal of the PGA from being connected to ground to being connected to the output terminal of the DAC; and step 2.4: differentially amplifying, by the PGA, the single-ended voltage to ground $U_S$ and the given voltage U1 of the to-be-measured resistor by a factor of A2 to obtain a second voltage $(U_S-U1)*A2$, performing, by the ADC, analog-to-digital conversion on the second voltage $(U_S-U1)*A2$ to obtain a second voltage digital quantity D2, and reading, by the microprocessor, the second voltage digital quantity D2 from the ADC; and step 3: calculating, by the microprocessor, a resistance value $R_S$ of the to-be-measured resistor according to the following equation:

$$R_S = R_N * A_{REF} * \left( \frac{D1'*p2}{p1} + \frac{D2}{A2} \right) * \frac{1}{D_{FS}},$$

wherein
R$_N$ represents a resistance value of the reference resistor, A$_{REF}$ represents an amplification factor of the first differential amplifier, and D$_{FS}$ is a maximum conversion output numeric value of the ADC.

7. The high-precision resistance measurement method according to claim 6, wherein the high-precision resistance measurement system further comprises a first switch element, wherein a control terminal of the first switch element is connected to the microprocessor, wherein before step 2, the microprocessor controls the first switch element to connect the second input terminal of the PGA to ground; and during step 2.3, the microprocessor controls the first switch element to connect the second input terminal of the PGA to the output terminal of the DAC.

8. The high-precision resistance measurement method according to claim 6, wherein the high-precision resistance measurement system further comprises a second switch element and a third switch element, wherein control terminals of the second switch element and the third switch element are both connected to the microprocessor, wherein before step 2, the microprocessor controls the second switch element to be turned on to connect the output terminal of the first differential amplifier to the voltage reference terminal of the ADC; after step 3, the microprocessor controls the second switch element to be turned off to disconnect the output terminal of the first differential amplifier from the voltage reference terminal of the ADC;

before step 2, the microprocessor controls the third switch element to be turned on to connect the output terminal of the first differential amplifier to the voltage reference terminal of the DAC; and after step 3, the microprocessor controls the third switch element to be turned off to disconnect the output terminal of the first differential amplifier from the voltage reference terminal of the DAC.

9. The high-precision resistance measurement method according to claim 6, wherein before step 2.1, the microprocessor sets an amplification factor of the PGA to A1 and after step 2.2 and before step 2.4 the microprocessor sets the amplification factor of the PGA to A2.

10. The high-precision resistance measurement method according to claim 6, wherein the constant-current source, the reference resistor, the to-be-measured resistor, and ground are connected in sequence to form the series branch, and the first input terminal of the PGA is connected to an ungrounded terminal of the to-be-measured resistor; or the high-precision resistance measurement system further comprises a second differential amplifier, wherein the constant-current source, the to-be-measured resistor, the reference resistor, and ground are connected in sequence to form the series branch, two input terminals of the second differential amplifier are respectively connected to two terminals of the to-be-measured resistor, an output terminal of the second differential amplifier is connected to the first input terminal of the PGA, and the second differential amplifier has a gain factor of 2.

11. The high-precision resistance measurement method according to claim 6, wherein a control terminal of the PGA is connected to the microprocessor, and an amplification factor of the PGA is set by the microprocessor.

12. The high-precision resistance measurement method according to claim 6, wherein an amplification factor of the PGA satisfies the following condition: a voltage value outputted by the PGA is less than a maximum conversion value of the ADC.

* * * * *